(12) United States Patent
Jiang et al.

(10) Patent No.: US 10,593,653 B2
(45) Date of Patent: Mar. 17, 2020

(54) PACKAGED INTEGRATED CIRCUIT DEVICES WITH THROUGH-BODY CONDUCTIVE VIAS, AND METHODS OF MAKING SAME

(71) Applicant: Micron Technology, Inc., Boise, ID (US)

(72) Inventors: Tongbi Jiang, Santa Clara, CA (US); Yong Poo Chia, Singapore (SG)

(73) Assignee: Micron Technology, Inc., Boise, ID (US)

( * ) Notice: Subject to any disclaimer, the term of this patent is extended or adjusted under 35 U.S.C. 154(b) by 313 days.

(21) Appl. No.: 14/802,941

(22) Filed: Jul. 17, 2015

(65) Prior Publication Data
US 2015/0325554 A1   Nov. 12, 2015

Related U.S. Application Data

(60) Division of application No. 14/273,138, filed on May 8, 2014, now Pat. No. 9,099,571, which is a
(Continued)

(51) Int. Cl.
*H01L 25/07* (2006.01)
*H01L 25/00* (2006.01)
(Continued)

(52) U.S. Cl.
CPC .......... *H01L 25/071* (2013.01); *H01L 21/561* (2013.01); *H01L 21/568* (2013.01); *H01L 21/76877* (2013.01); *H01L 21/82* (2013.01); *H01L 23/3107* (2013.01); *H01L 23/3114* (2013.01); *H01L 23/3142* (2013.01); *H01L 23/481* (2013.01); *H01L 23/5389* (2013.01); *H01L 24/19* (2013.01); *H01L 24/27* (2013.01); *H01L 24/32* (2013.01); *H01L 24/83* (2013.01); *H01L 24/96* (2013.01); *H01L 24/97* (2013.01);
(Continued)

(58) Field of Classification Search
CPC . H01L 25/071; H01L 25/074; H01L 23/3107; H01L 23/3114; H01L 23/481; H01L 23/5389; H01L 23/3185
See application file for complete search history.

(56) References Cited

U.S. PATENT DOCUMENTS

| 4,500,905 A | 2/1985 | Shibata |
| 5,034,347 A | 7/1991 | Kakihana |

(Continued)

FOREIGN PATENT DOCUMENTS

| DE | 102005043557 A1 | 9/2006 |
| JP | 2005005632 | 1/2005 |

(Continued)

OTHER PUBLICATIONS

Office Action dated Mar. 8, 2016 in Korean Application No. 10-2010-7003568, 21 pages.
(Continued)

*Primary Examiner* — Tucker J Wright
(74) *Attorney, Agent, or Firm* — Perkins Coie LLP

(57) ABSTRACT

A device is disclosed which includes at least one integrated circuit die, at least a portion of which is positioned in a body of encapsulant material, and at least one conductive via extending through the body of encapsulant material.

7 Claims, 9 Drawing Sheets

Related U.S. Application Data continuation of application No. 12/852,925, filed on Aug. 9, 2010, now Pat. No. 8,723,307, which is a division of application No. 11/834,765, filed on Aug. 7, 2007, now Pat. No. 7,781,877.

(51) Int. Cl.

| | | |
|---|---|---|
| *H01L 23/31* | (2006.01) | |
| *H01L 23/48* | (2006.01) | |
| *H01L 21/768* | (2006.01) | |
| *H01L 21/82* | (2006.01) | |
| *H01L 23/00* | (2006.01) | |
| *H01L 21/56* | (2006.01) | |
| *H01L 23/538* | (2006.01) | |
| *H01L 25/10* | (2006.01) | |

(52) U.S. Cl.
CPC .......... *H01L 25/105* (2013.01); *H01L 25/50* (2013.01); *H01L 2221/68359* (2013.01); *H01L 2224/04105* (2013.01); *H01L 2224/12105* (2013.01); *H01L 2224/20* (2013.01); *H01L 2224/32145* (2013.01); *H01L 2224/838* (2013.01); *H01L 2224/83193* (2013.01); *H01L 2225/06548* (2013.01); *H01L 2225/1035* (2013.01); *H01L 2225/1058* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01075* (2013.01); *H01L 2924/01078* (2013.01); *H01L 2924/01082* (2013.01); *H01L 2924/10253* (2013.01); *H01L 2924/12042* (2013.01); *H01L 2924/14* (2013.01); *H01L 2924/181* (2013.01); *H01L 2924/19041* (2013.01); *H01L 2924/19043* (2013.01)

(56) References Cited

U.S. PATENT DOCUMENTS

| | | | |
|---|---|---|---|
| 5,682,062 | A | 10/1997 | Gaul |
| 5,744,827 | A | 4/1998 | Jeong et al. |
| 5,876,765 | A | 3/1999 | Hinterlechner |
| 5,973,393 | A | 10/1999 | Chia et al. |
| 5,994,166 | A | 11/1999 | Akram et al. |
| 6,124,149 | A | 9/2000 | Paik et al. |
| 6,137,163 | A | 10/2000 | Kim et al. |
| 6,222,265 | B1 | 4/2001 | Akram et al. |
| 6,252,299 | B1 | 6/2001 | Masuda et al. |
| 6,313,522 | B1 | 11/2001 | Akram et al. |
| 6,340,838 | B1 | 1/2002 | Chung et al. |
| 6,404,044 | B2 | 6/2002 | Akram et al. |
| 6,476,476 | B1 | 11/2002 | Glenn |
| 6,479,322 | B2 | 11/2002 | Kawata et al. |
| 6,531,338 | B2 | 3/2003 | Akram et al. |
| 6,555,918 | B2 | 4/2003 | Masuda et al. |
| 6,577,013 | B1 | 6/2003 | Glenn et al. |
| 6,614,104 | B2 | 9/2003 | Farnworth et al. |
| 6,674,161 | B1 | 1/2004 | Haba |
| 6,737,750 | B1 | 5/2004 | Hoffman et al. |
| 6,798,057 | B2 | 9/2004 | Bolkin et al. |
| 6,853,503 | B2 | 2/2005 | Nomura et al. |
| 6,946,325 | B2 | 9/2005 | Yean et al. |
| 6,979,895 | B2 | 12/2005 | Akram et al. |
| 6,995,055 | B2 | 2/2006 | Yoshida et al. |
| 7,208,825 | B2 | 4/2007 | Pu et al. |
| 7,215,033 | B2 | 5/2007 | Lee et al. |
| 7,294,920 | B2 | 11/2007 | Chen et al. |
| 7,344,917 | B2 | 3/2008 | Gautham |
| 7,589,410 | B2 | 9/2009 | Kim |
| 8,723,307 | B2 | 5/2014 | Chia et al. |
| 2004/0070083 | A1 | 4/2004 | Su |
| 2004/0082100 | A1 | 4/2004 | Tsukahara et al. |
| 2004/0110323 | A1 | 6/2004 | Becker et al. |
| 2004/0145044 | A1 | 7/2004 | Sugaya et al. |
| 2005/0093170 | A1 | 5/2005 | Kalidas et al. |
| 2006/0043573 | A1 | 3/2006 | Hedler et al. |
| 2006/0163728 | A1 | 7/2006 | Nakanishi et al. |
| 2007/0018313 | A1* | 1/2007 | Gomyo ............... H01L 21/568 257/723 |
| 2007/0035015 | A1* | 2/2007 | Hsu ..................... H01L 23/5389 257/723 |
| 2007/0099345 | A1 | 5/2007 | Bauer et al. |
| 2008/0308921 | A1* | 12/2008 | Kim ..................... H01L 21/561 257/686 |
| 2009/0039523 | A1 | 2/2009 | Jiang et al. |
| 2010/0320585 | A1 | 12/2010 | Jiang et al. |
| 2014/0242751 | A1 | 8/2014 | Jiang et al. |

FOREIGN PATENT DOCUMENTS

| | | |
|---|---|---|
| KR | 1020050021078 A | 3/2005 |
| KR | 1020070057038 A | 6/2007 |

OTHER PUBLICATIONS

Demmin, J. et al., "Stacked Chip Scale Packages: Manufacturing Issues, Reliability Results, and Cost Analysis," 2003 IEEE/SEMI Int'l Electronics Manufacturing Technology Symposium, pp. 241-247, Jul. 2003.

Gilleo, K., "Flex-Based Packaging Solutions—from CSPs to MEMs," 6th Annual Flexible Circiut Conference (IPC), Dallas, TX, Jun. 2000.

International Search Report and Written Opinion dated Dec. 15, 2008 in International Application No. PCT/US2008/071994.

Office Action dated Apr. 26, 2011 in People's Republic of China Application No. 200880102233.5, 16 pages.

Office Action dated Aug. 7, 2012 in Japan Application No. 2010-520232, 4 pages.

Office Action dated May 30, 2012 in Taiwan Application No. 097130125, 14 pages.

Office Action dated Oct. 26, 2016 in Korea Application No. 10-2010-7003568, 6 pages.

Extended European Search Report dated Nov. 18, 2016 in European Application No. 08835386.7, 5 pages.

EP Patent Application No. 08835386.7—European Office Action, dated Jul. 24, 2017, 6 pages.

\* cited by examiner

PACKAGED INTEGRATED CIRCUIT DEVICES WITH THROUGH-BODY CONDUCTIVE VIAS, AND METHODS OF MAKING SAME

CROSS-REFERENCE TO RELATED APPLICATION

This application is a divisional of U.S. application Ser. No. 14/273,138 filed May 8, 2014, which is a continuation of U.S. application Ser. No. 12/852,925 filed Aug. 9, 2010, now U.S. Pat. No. 8,723,307, which is a divisional of U.S. application Ser. No. 11/834,765 filed Aug. 7, 2007, now U.S. Pat. No. 7,781,877, each of which is incorporated herein by reference in its entirety.

BACKGROUND OF THE INVENTION

1. Technical Field

This subject matter disclosed herein is generally directed to the field of packaging integrated circuit devices, and, more particularly, to packaged integrated circuit devices with through-body conductive vias and various methods of making same.

2. Description of the Related Art

Integrated circuit technology uses electrical devices, e.g., transistors, resistors, capacitors, etc., to formulate vast arrays of functional circuits. The complexity of these circuits requires the use of an ever-increasing number of linked electrical devices so that the circuit may perform its intended function. As the number of transistors increases, the integrated circuitry dimensions shrink. One challenge in the semiconductor industry is to develop improved methods for electrically connecting and packaging circuit devices which are fabricated on the same and/or on different wafers or chips. In general, it is desirable in the semiconductor industry to construct transistors which occupy less surface area on the silicon chip/die.

In the manufacture of semiconductor device assemblies, a single semiconductor die is most commonly incorporated into each sealed package. Many different package styles are used, including dual inline packages (DIP), zig-zag inline packages (ZIP), small outline J-bends (SOJ), thin small outline packages (TSOP), plastic leaded chip carriers (PLCC), small outline integrated circuits (SOIC), plastic quad flat packs (PQFP) and interdigitated leadframe (IDF). Some semiconductor device assemblies are connected to a substrate, such as a circuit board, prior to encapsulation. Manufacturers are under constant pressure to reduce the size of the packaged integrated circuit device and to increase the packaging density in packaging integrated circuit devices.

In some cases, packaged integrated circuit devices have been stacked on top of one another in an effort to conserve plot space. Prior art techniques for conductively coupling the stacked packaged integrated circuit devices to one another typically involved the formation of solder balls or wire bonds to establish this connection. What is desired is a new and improved technique for conductively coupling stacked packaged integrated circuit devices to one another.

BRIEF DESCRIPTION OF THE DRAWINGS

The present subject matter may be understood by reference to the following description taken in conjunction with the accompanying drawings, in which like reference numerals identify like elements, and in which.

Figure 1:
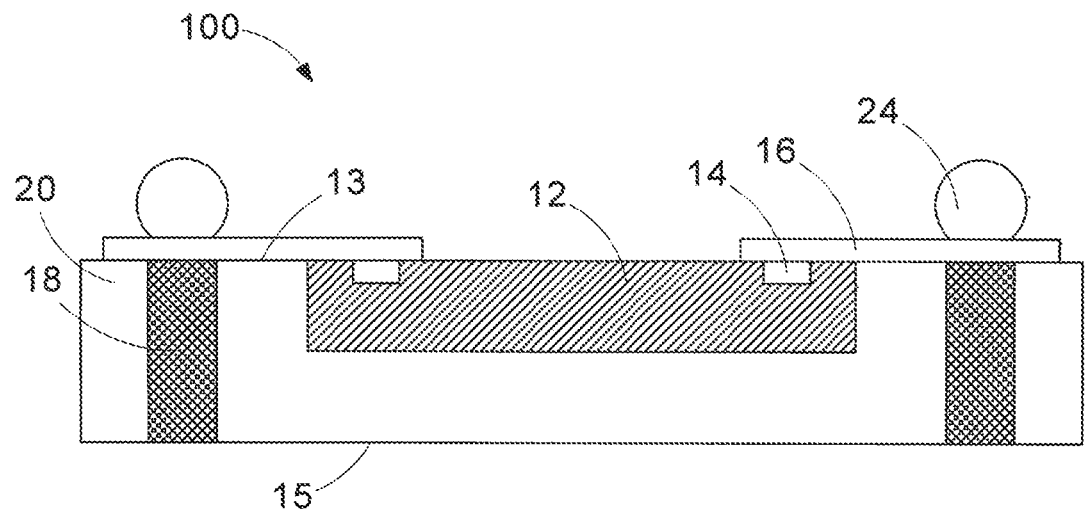
FIG. 1 is a schematic depiction of an illustrative packaged integrated circuit die with a plurality of conductive through-body vias as described herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Although various regions and structures shown in the drawings are depicted as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the subject matter disclosed herein.

FIG. 1 depicts one illustrative embodiment of a packaged integrated circuit device 100 as described herein. The packaged integrated circuit device 100 comprises an integrated circuit die 12 having a plurality of bond pads 14, conductive wiring lines 16 (sometimes referred to as a redistribution layer (RDL)), and at least one conductive interconnection 18 (sometimes referred to as conductive vias) that extend through a body 20 of encapsulant material, e.g., mold compound material. The conductive via 18 defines a conductive flow path through the thickness of the body 20, i.e., between the front 13 and back 15 of the body 20. The conductive via 18 and the integrated circuit die 12 may be conductively coupled to one another using a variety of known techniques and structures. In the depicted example, the conductive wiring line 16 conductively couples the conductive via 18 to the integrated circuit die 12. A plurality of schematically depicted solder balls 24 are formed on the packaged integrated circuit device 100 in accordance with known processing techniques. The solder balls 24, or other like connections, may be employed to conductively couple the packaged integrated circuit device 100 to another structure, e.g., a printed circuit board. In FIG. 1, the die 12 is embedded in the body of encapsulant material 20. As used herein, when it is stated that one or more die 12 are embedded in a body of encapsulant material, it is to be understood that only portions of the body of the die 12 need to be positioned in the encapsulant material. It is not required that the encapsulant material surround all sides of the body of the die 12, although that configuration may be employed if needed depending upon the particular application.

Figure 2:
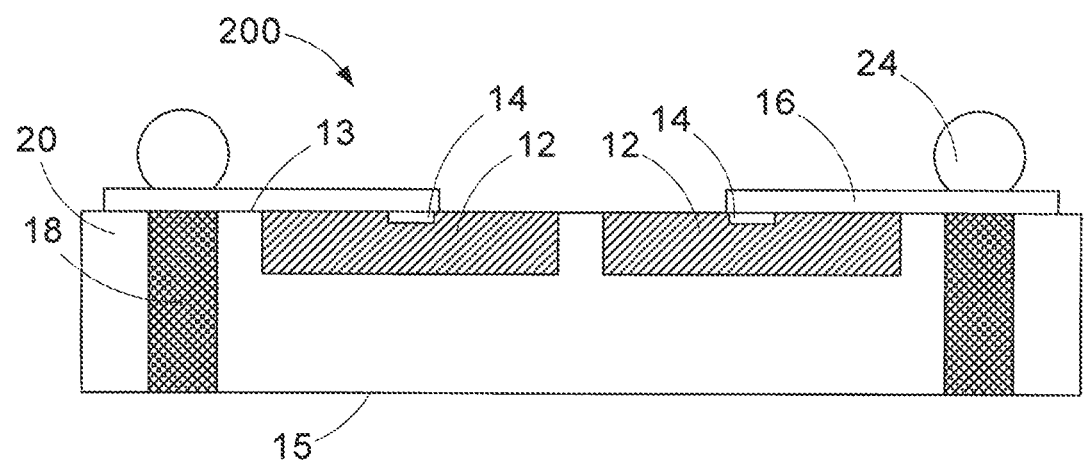
FIG. 2 is a schematic depiction of an illustrative packaged integrated circuit comprised of multiple die with a plurality of conductive through-body vias as described herein.

FIG. 2 depicts one illustrative embodiment of a packaged integrated circuit device 200 as described herein. The packaged integrated circuit device 200 comprises a plurality of integrated circuit die 12 (two are shown) embedded in a single body 20 of encapsulant material, e.g., mold compound material. In the illustrative example depicted herein, each of the die 12 have the same physical size. However, as will be understood by those skilled in the art after a complete reading of the present application, the die 12 are not required to be the same physical size, nor do they have to perform the same function. Each of the die 12 shown in FIG. 2 have a plurality of bond pads 14, conductive wiring lines 16 (sometimes referred to as a redistribution layer (RDL)), and at least one conductive interconnection 18 (sometimes referred to as conductive vias) that extend through the body 20 of encapsulant material. Since the device 200 comprises a plurality of integrated circuit die 12, it may be considered to be a multi-chip module (MCM). As in FIG. 1, a plurality of schematically depicted solder balls 24 are formed on the packaged integrated circuit device 200 in accordance with known processing techniques. The solder balls 24, or other like connections, may be employed to conductively couple the packaged integrated circuit device 200 to another structure, e.g., a printed circuit board.

In the depicted embodiment, each of the conductive vias 18 in FIG. 2 extend through the thickness of the body 12. The conductive coupling between and among the conductive vias 18 and the embedded integrated circuit die 12 may b established using any of a variety of known techniques and structures. In the example shown in FIG. 2, at least one of the conductive vias 18 is conductively coupled to one of the integrated circuit die 12 by one or more wiring lines 16, while another of the conductive vias 18 is conductively coupled to the other integrated circuit die 12 by one or more wiring lines 16 as well.

As will be recognized by those skilled in the art after a complete reading of the present application, the methods and techniques disclosed herein may be applied to virtually any type of integrated circuit device that may be formed on the die 12. Additionally, the configuration and location of the schematically depicted bond pads 14, the conductive wiring lines 16, and the through-body conductive interconnections 18 may vary depending upon the particular application.

Figure 3:
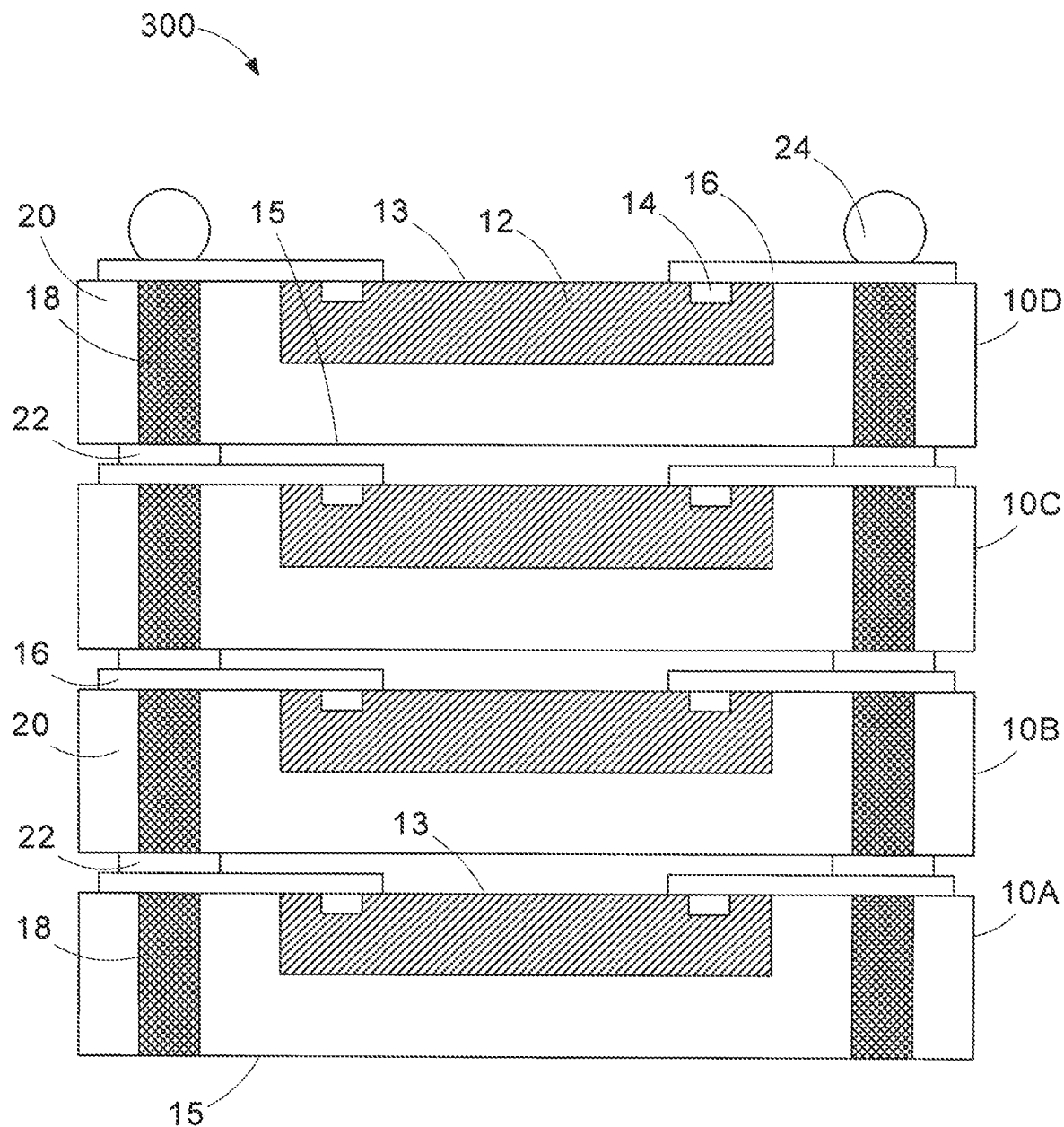
FIG. 3 is a schematic cross-sectional view of an illustrative stacked packaged device disclosed herein.
Figure 4:
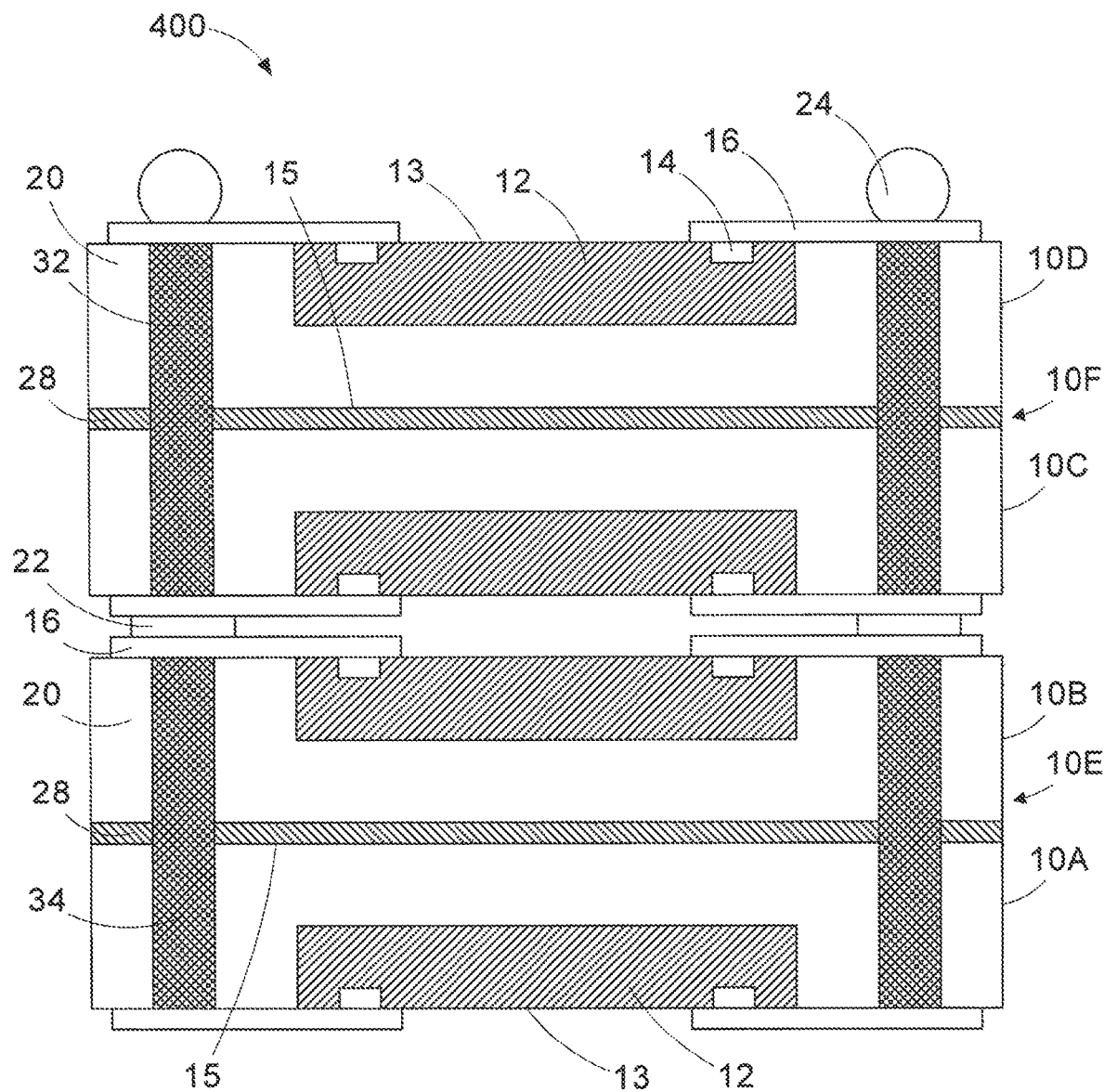
FIG. 4 is a schematic cross-sectional view of another illustrative stacked packaged device disclosed herein.
Figure 5:
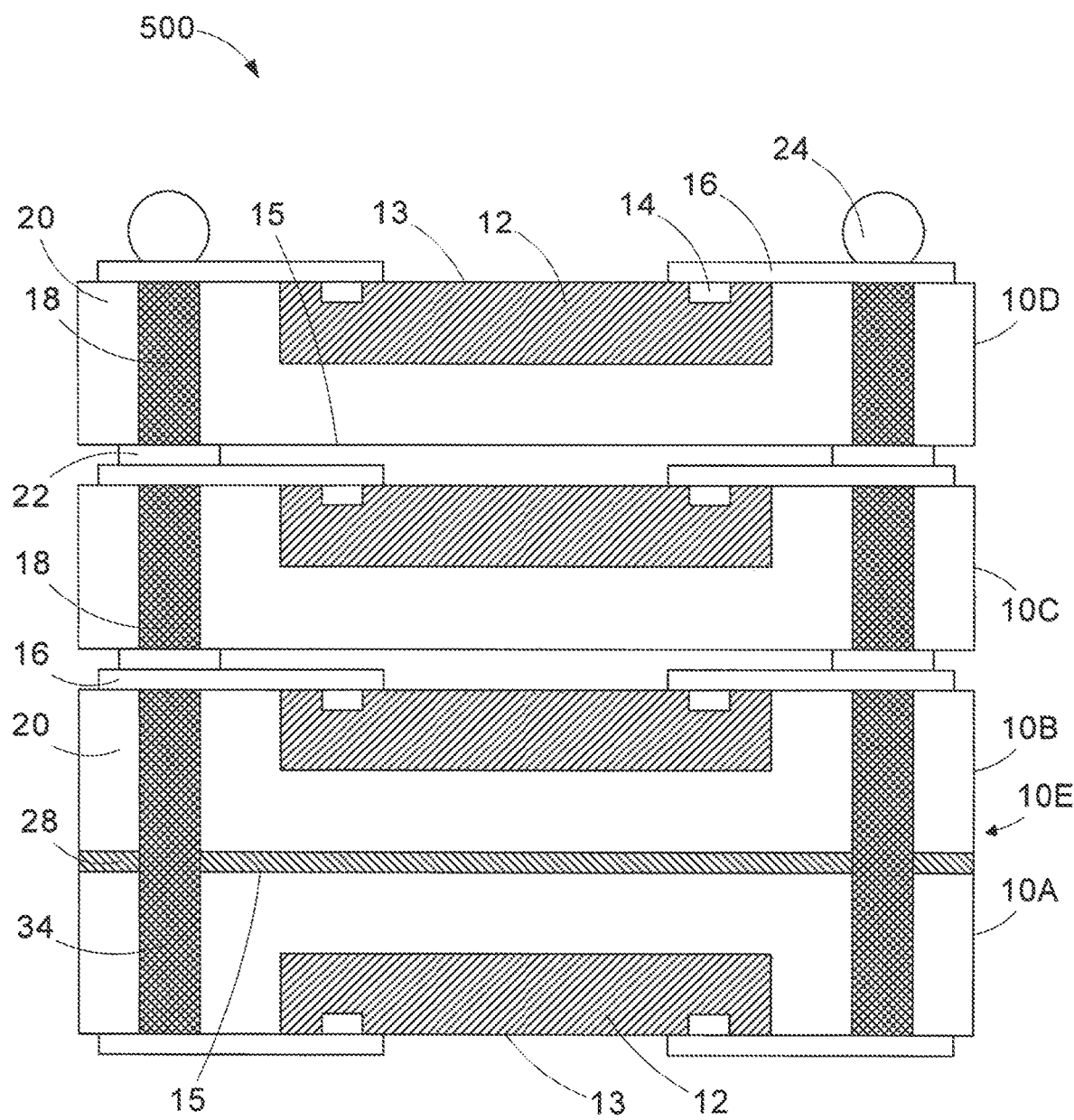
FIG. 5 is a schematic cross-sectional view of yet another illustrative stacked packaged device disclosed herein.

FIGS. 3-5 are schematic cross-sectional views of a plurality of stacked and packaged integrated circuit devices, in the illustrative example depicted in FIG. 3, the stacked package 300 comprises a plurality of individual embedded die 10A-10D. In the illustrative example depicted in FIG. 3, only four illustrative individual embedded die 10A-10D are depicted. As set forth above, it is to be understood that in referring to an embedded die or an individual embedded die, the structure need only comprise at least one integrated circuit die with a portion of the die body positioned in the body 20 of encapsulant material. However, as will be recognized by one skilled in the art after a complete reading of the present application, the number of individual embedded die 10 in the stacked package 300 may vary depending upon the particular application, i.e., the number of individual embedded die 10 within such a stack 300 may be more or less than the illustrative four depicted in FIG. 3.

Each of the illustrative individual embedded die 10A-10D in FIG. 3 comprise an integrated circuit die 12, a plurality of bond pads 14, conductive wiring lines 16 (sometimes referred to as a redistribution layer (RDL)), a plurality of conductive interconnections 18 (sometimes referred to as conductive vias) that extend through the body 20 of encapsulated material. A plurality of conductive structures 22 are provided between adjacent individual embedded die 10 to provide an electrically conductive path between the various embedded die 10A-10D. A plurality of schematically depicted solder balls 24 are formed on the packaged die 10D in accordance with known processing techniques. The solder balls 24, or other like connections, may be employed to conductively couple the stacked package 300 to another structure, e.g., a printed circuit board.

As will be recognized by those skilled in the art after a complete reading of the present application, the methods and techniques disclosed herein may be applied to virtually any type of integrated circuit device that may be formed on the die 12 and packaged in a stacked configuration. Additionally, the configuration and location of the schematically depicted bond pads 14, conductive interconnections 18 and conductive structures 22 shown in FIG. 3 may vary depending upon the particular application. In the embodiment depicted in FIG. 3, all of the packaged die are oriented with the front side 13 of the embedded die 10 facing a backside 15 of an adjacent embedded die 10.

FIG. 4 depicts another illustrative embodiment of a stacked packaged device 400. Similar to the embodiment shown in FIG. 3, the embodiment in FIG. 4 comprises four illustrative individual embedded die 10A-10D. In FIG. 4, the individual embedded die 10A-10D are assembled as groups 10E and 10F prior to assembling these groups into the structure shown in FIG. 4. The first group 10E comprises the individual embedded die 10A and 10B, while the second group 10F comprises the individual embedded die 10C and 10D). A plurality of conductive interconnections or vias 32 extend through the bodies 20 of the plurality of die 10 that comprise the first group 10E, while a plurality of conductive interconnections or vias 34 extend through the bodies 20 of the plurality of the die 10 that comprise the second group 10F.

A plurality of conductive structures 22 provide an electrically conductive path between the two groups 10E and 10F. The individual embedded die 10 within each group may be secured to one another using an adhesive material 28. Note that, in the illustrative example depicted in FIG. 4, the backside 15 of adjacent embedded die 10 are positioned facing one another. As will be recognized by those skilled in the art after a complete reading of the present application, the number of groups, e.g., groups 10E and 10F, that may be stacked as depicted in FIG. 4 may vary depending upon the particular application, i.e., more or less than the illustrative two groups depicted in FIG. 4 may be assembled into the final stacked package 400. Similarly, the number of individually embedded die 10 within each group may be greater than the illustrative two depicted in the groups 10e and 10F in FIG. 4.

The structures depicted in FIGS. 3 and 4 may be combined if desired. For example, FIG. 5 depicts an illustrative stacked packaged device 500 wherein the bottom two embedded die 10A-10B are packaged as a group 10E, while the upper two embedded die 10C-10D are packaged as depicted in FIG. 3. Thus, it is readily apparent that the methodologies and devices disclosed herein provide great flexibility as it relates to creating stacked packaged devices to thereby reduce plot space consumption and improve packaging densities. Moreover, in FIGS. 3-5, each of the individual embedded die 10 are depicted as having a single integrated circuit die 12 embedded therein. In accordance with one aspect of the present disclosure, the individual embedded die 10 may comprise a plurality of individual integrated circuit die 12, like the multi-chip embodiment depicted in FIG. 2. That is, the methods and devices disclosed herein may be employed with individual embedded die 10 that comprise single or multiple integrated circuit die 12. For ease of reference, the following description will make reference to an individual embedded die 10 comprised of a single integrated circuit die 12, although the methods may readily be applied to embedding a plurality of integrated circuit die 12 in a single body 20 of encapsulant material of an individual embedded die.

Figure 6A:
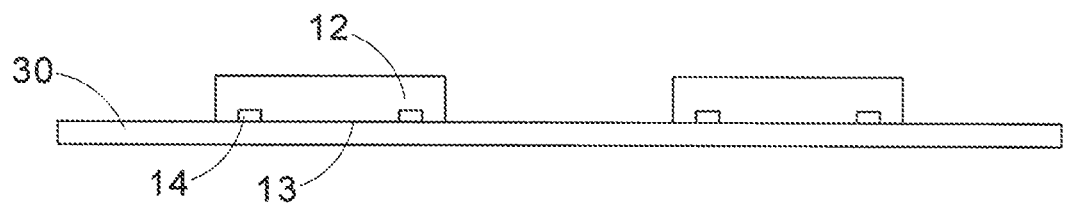
FIGS. 6A-6H schematically depict one illustrative method of forming the stacked packaged devices disclosed herein.
Figure 6B:
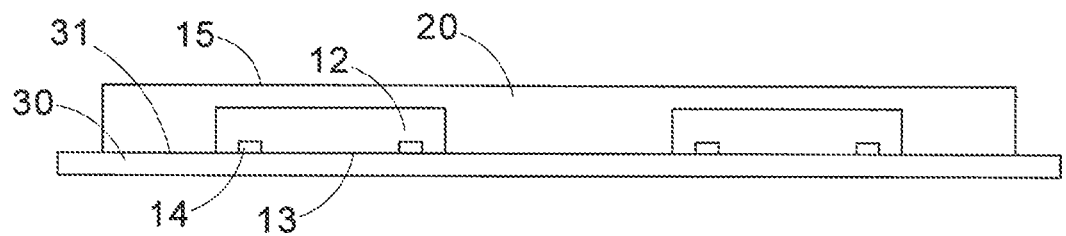
Figure 6C:
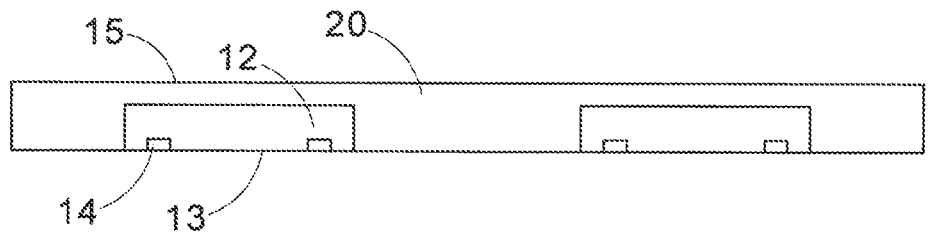

FIGS. 6A-6H depict one illustrative method of forming the devices disclosed herein. In FIG. 6A, a plurality of known good integrated circuit die 12 are placed front side 13 down above an illustrative sacrificial structure 30. In one illustrative example, the sacrificial structure 30 may be a film frame with dicing tape positioned across the film frame. The structure 30 is sacrificial in the sense that it will later be removed, in FIG. 6B, a body 20 of encapsulant material, e.g., mold compound, is formed around the integrated circuit die 12 and above the structure 30, i.e., the integrated circuit die 12 is embedded in the body 20. Traditional molding techniques, e.g., injection molding, may be performed to form the body 20 of encapsulant material. Thereafter, as shown in FIG. 6C, the sacrificial structure 30 may be removed. In the illustrative example described herein, the structure 30 may simply be peeled away due to the use of the adhesive tape as part of the structure 30.

Figure 6D:
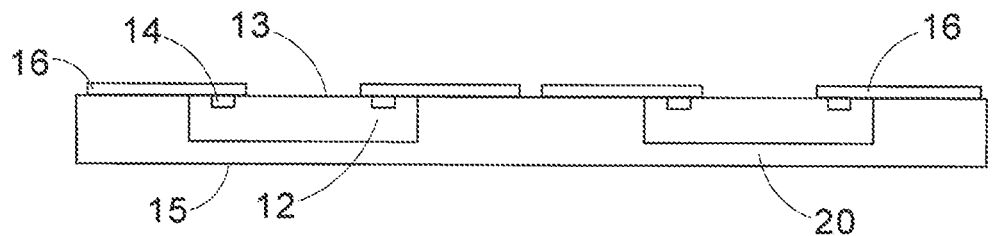
Figure 6E:
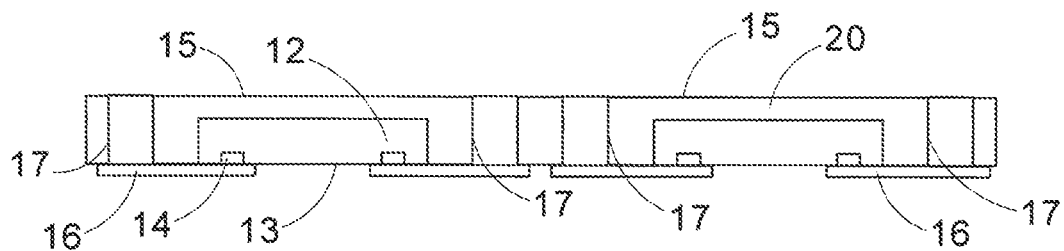
Figure 6F:
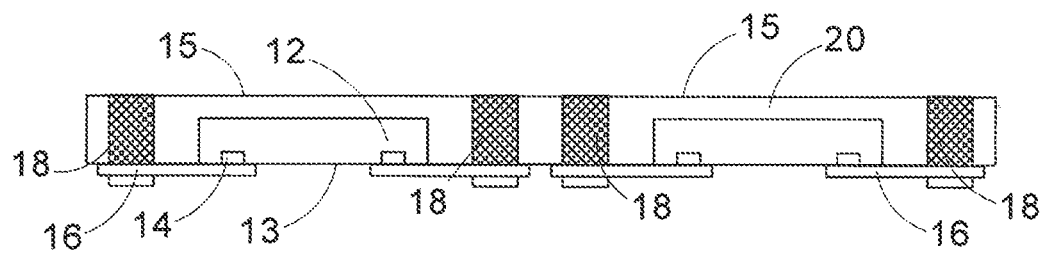

Next, as shown in FIG. 6D, the conductive lines 16 are formed above the front side 13 of the integrated circuit die 12 and body 12 in accordance with traditional techniques. Of course, the conductive lines 16 may have any desired configuration and they may be made from any desired material. Then, as indicated in FIG. 6E, a plurality of openings or vias 17 are formed through the body 20 as indicated. The openings 17 may be formed by a variety of known techniques, e.g., laser drilling, etching etc. In some applications, a masking layer (not shown) may be formed as part of the process of forming the openings 17. The openings 17 may be of any desired shape or configuration. Note that, in the illustrative example depicted herein, the openings 17 are formed from the backside 15 toward the front side 13 of the body 20 of the embedded die 10. Also note that, in this particular example, the openings 17 expose, but do not extend through, the conductive interconnections 16 formed on the front side 13 of the embedded die 10. Thereafter, as shown FIG. 6F, the openings 17 are filled with a conductive material, e.g., copper, aluminum, silver, etc., to form the conductive interconnections 18. The conductive material may be formed in the openings 17 using any of a variety of known techniques, e.g., plating, deposition, etc., and a variety of different conductive materials may be employed, depending upon the particular application.

Figure 6G:
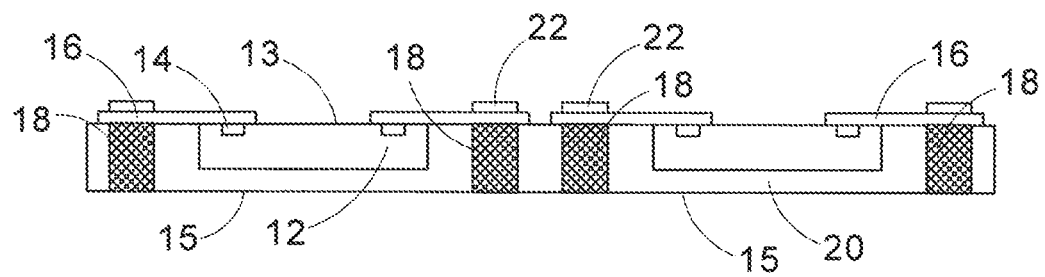
Figure 6H:
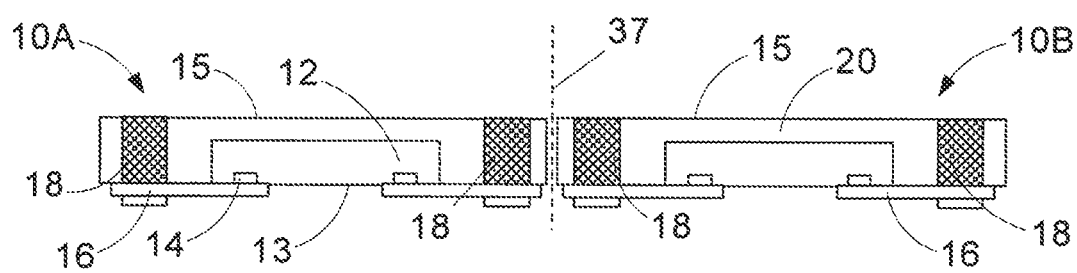

In FIG. 6G, a plurality of conductive structures 22 are formed on the embedded die 10A-10B using known techniques. In some cases, the conductive structures 22 may be formed as part of the process of forming the conductive interconnections 18. Then, as shown in FIG. 6H, a dicing or singulating process is performed along cut line 37 to produce the illustrative individual embedded die 10A and 10B.

Next, the individual embedded die 10A-10B are subject to a variety of tests to confirm their acceptability for their intended application. Once the embedded die 10A-10B have successfully passed such tests, they are ready to be shipped to customers. In other applications, the tested embedded die 10A-10B may be assembled into a stacked packaged device 300, 400, 500 as depicted herein. In the example depicted in FIG. 3, a plurality of individual embedded die 10 are positioned as depicted in FIG. 3 and a reflow process is performed to establish the electrical connection between the conductive structures 22 on an individual embedded die, e.g., die 10A, and the conductive interconnections 18 on an adjacent embedded die, e.g., die 10B. The illustrative solder balls 24 may be formed on the illustrative die 10 using traditional techniques. The solder balls 24 may be formed at any desired point during the process flow. For example, the solder balls 24 may be formed after all of the embedded die 10A-10D are assembled as depicted in FIG. 3. Alternatively, the solder balls 24 may be formed above the individual embedded die 10D prior to assembling the individual embedded die 10D with the other individual embedded die as depicted in FIG. 3.

Figure 7A:
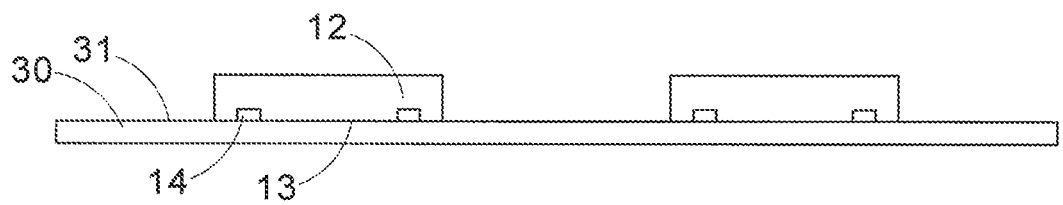
FIGS. 7A-7I schematically depict another illustrative method of forming the stacked packaged devices disclosed herein.
Figure 7B:
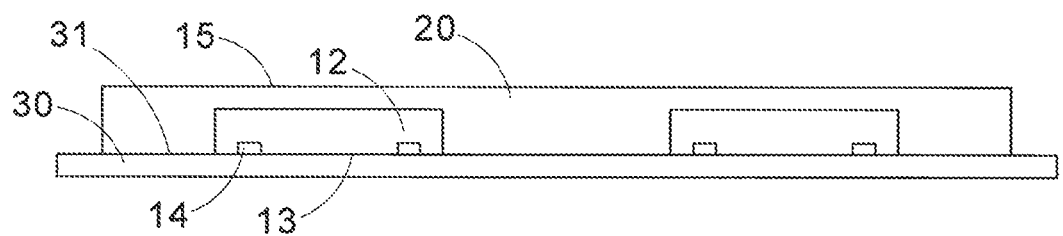
Figure 7C:
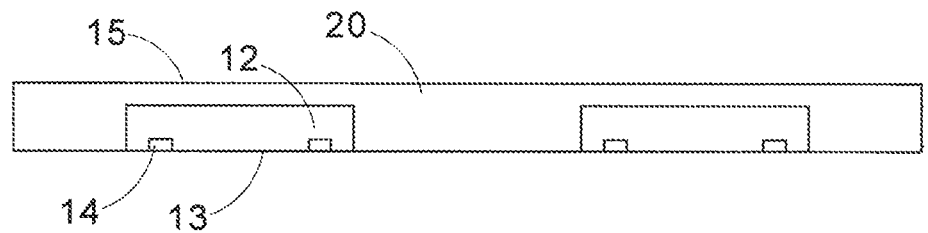
Figure 7D:
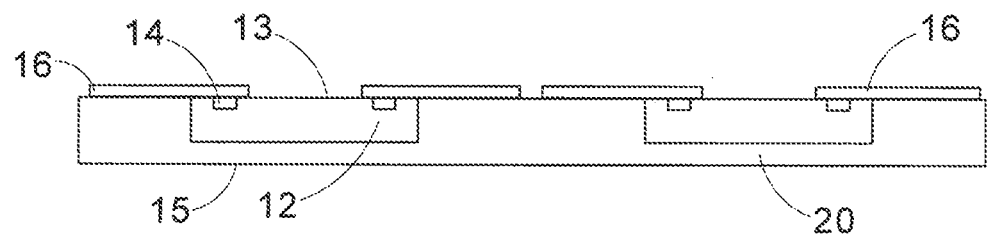
Figure 7E:
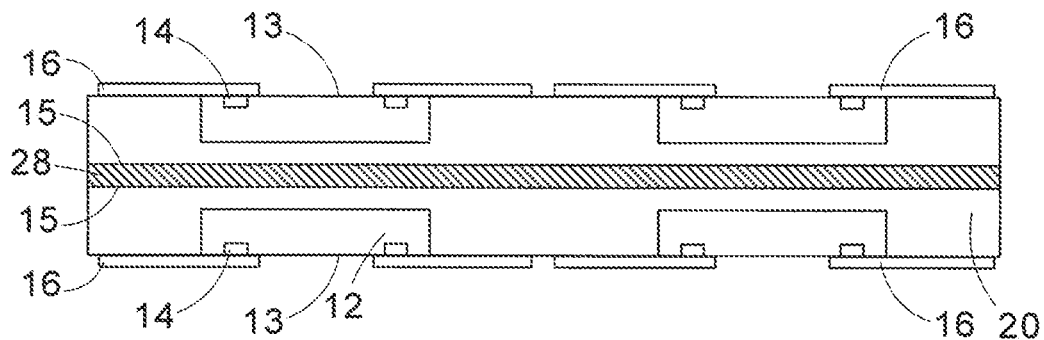
Figure 7F:
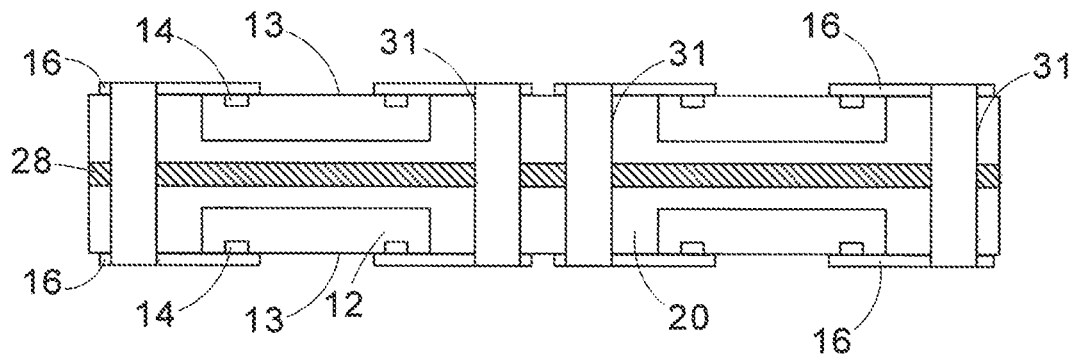

FIGS. 7A-7I depict another illustrative method of forming the devices disclosed herein. The steps depicted in FIGS. 7A-7I) are the same as those previously described with respect to FIGS. 6A-6D. Thus, a detailed discussion of FIGS. 7A-7D will not be repeated. In FIG. 7E, a plurality of the structures depicted in FIG. 7D are secured to one another using an adhesive material 28. Thereafter, in FIG. 7F, a plurality of openings or vias 31 are formed through the bodies 20 of the combined structure depicted in FIG. 7E. The openings 31 may be formed by a variety of known techniques, e.g., laser drilling, etching etc. In some applications, a masking layer (not shown) may be formed as part of the process of forming the openings 31. The openings 31 may be of any desired shape or configuration. Note that, in the illustrative example depicted herein, the openings 31 extend through the conductive interconnections 16 formed on the front side 13 of each of the individual structures. Thereafter, as shown FIG. 7G, the openings 31 are filled with a conductive material, e.g., copper, aluminum, silver, etc., to form the through body conductive vias 32. The conductive material may be formed in the openings 31 using any of a variety of known techniques, e.g., plating, deposition, etc., and a variety of different conductive materials may be employed, depending upon the particular application.

Figure 7G:
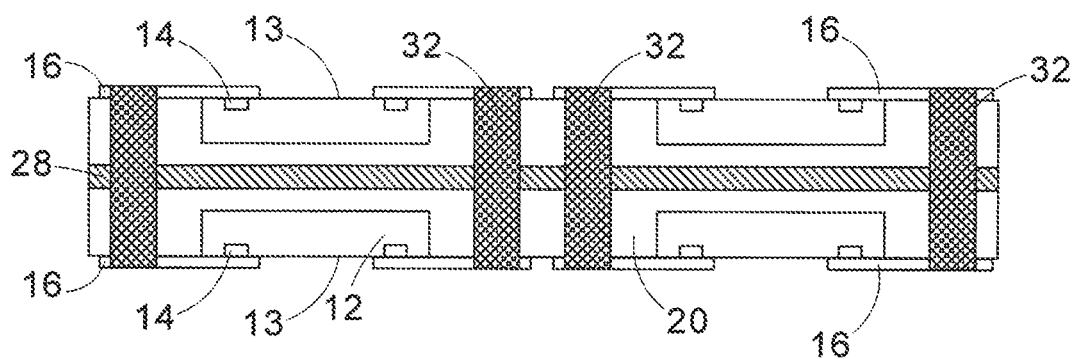
Figure 7H:
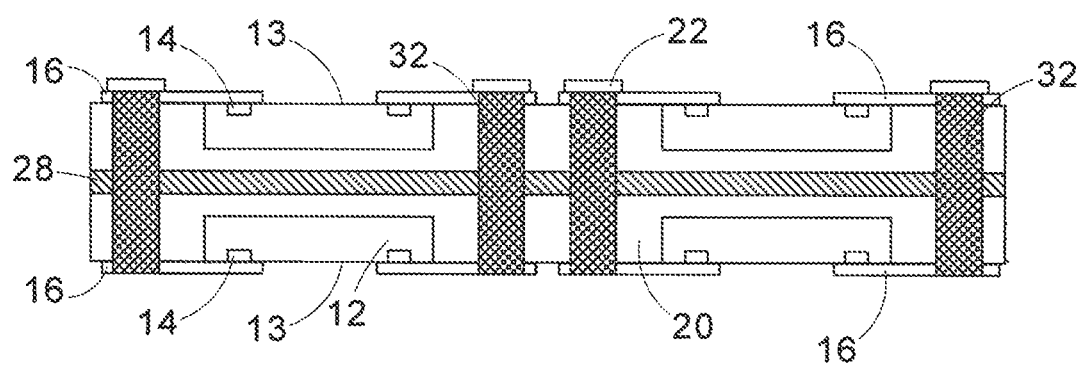
Figure 7I:
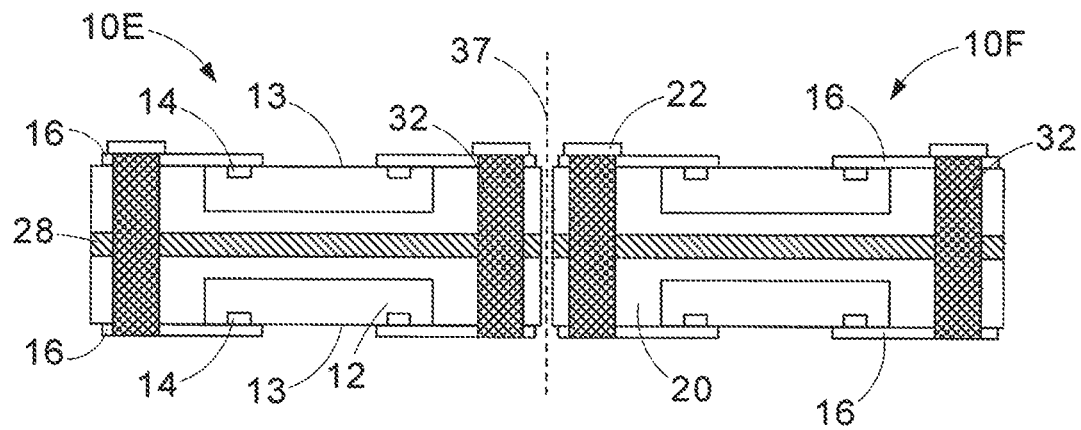

In FIG. 7H, a plurality of conductive structures 22 are formed on the structure depicted in FIG. 7G using known techniques. In some cases, the conductive structures 22 may be formed as part of the process of forming the conductive interconnections 32. Next, as shown in FIG. 7I, a dicing or singulating process is performed along cut line 37 to produce the illustrative groups 10E and 10F of the individual embedded die.

Next, the groups of embedded die 10E-10F are subject to a variety of tests to confirm their acceptability for their intended application. Once the groups 10E-10F have successfully passed such tests, they are ready to be shipped to a customer. In some applications, the groups of embedded die 10E-10F may be assembled into a stacked packaged device as described herein. In the example depicted in FIG. 4, the groups of embedded die 10E and 10F are positioned as depicted in FIG. 4 and a reflow process is performed to establish the electrical connection between the conductive structures 22 on the first group 10E and the conductive vias 32 on an adjacent group 10F. The illustrative solder balls 24 may be formed on an illustrative individual embedded die in the group 10F using traditional techniques. The solder balls 24 may be formed at any desired point during the process flow. For example, the solder balls 24 may be formed after the two illustrative groups 10E-10F are assembled as depicted in FIG. 4. Alternatively, the solder balls 24 may be formed above one of the individual embedded die in the group 10F prior to assembling the two groups together as depicted in FIG. 4.

As will be recognized by those skilled in the art after a complete reading of the present application, the present disclosure may provide very efficient means for packaging individual die and providing stacked packaged integrated circuit devices. Much of the processing performed herein may be performed on multiple die at a single time as opposed to performing such operations on individual die one at a time. For example, although two illustrative die 12 are depicted in FIGS. 6A-6H and 7A-7I, the processing steps described herein may be performed on any desired number of die, depending upon the processing capability of the processing tools employed. In short, wafer level processing techniques may be employed to increase the efficiency of packaging operations, i.e., the processing operations may be performed on multiple die at the same time.

What is claimed:

1. A device, comprising:
    a first group of embedded die and a second group of embedded die vertically aligned with the first group, wherein each of the first and second groups of embedded die comprise a vertically-aligned plurality of individual embedded die, each of the individual embedded die comprise an integrated circuit die and a body of encapsulant material, and each integrated circuit die has a back side that is embedded in the body of encapsulant material and a front side that is generally flush with an outermost surface of the first group or the second group of embedded die;
    at least one first conductive via that extends through the first group of embedded die;
    at least one second conductive via that extends through the second group of embedded die; and
    at least one conductive structure positioned between the first and second groups of embedded die that provides an electrically conductive flow path between the first and second conductive vias.

2. The device of claim 1, wherein the back side of each integrated circuit die of the individual embedded die in each of the first and second groups of embedded die are positioned facing one another.

3. The device of claim 2, wherein the first conductive via extends from the front side of an integrated circuit die of an individual embedded die in the first group of embedded die to the front side of another integrated circuit die of another individual embedded die in the first group of embedded die.

4. The device of claim 2, further comprising an adhesive material positioned between the facing back sides of the integrated circuit dies of the individual embedded die.

5. The device of claim 1, wherein the first conductive via is formed through the body of encapsulant material of all of the individual embedded die in the first group of embedded die.

6. The device of claim 5, wherein the second conductive via is formed through the body of encapsulant material of all of the individual embedded die in the second group of embedded die.

7. The device of claim 1, wherein the first and second groups of embedded die are stacked vertically above one another.

* * * * *